United States Patent [19]

Guldi

[11] Patent Number: 5,547,891
[45] Date of Patent: Aug. 20, 1996

[54] STRUCTURAL MODIFICATION TO ENHANCE DRAM GATE OXIDE QUALITY

[75] Inventor: Richard L. Guldi, Dallas, Tex.

[73] Assignee: Texas Instruments Incorporated, Dallas, Tex.

[21] Appl. No.: 268,863

[22] Filed: Jun. 29, 1994

Related U.S. Application Data

[63] Continuation of Ser. No. 907,414, Jul. 1, 1992, abandoned.

[51] Int. Cl.⁶ .................................................. H01L 21/8242
[52] U.S. Cl. ............................ 437/52; 437/60; 437/235
[58] Field of Search ................................ 437/24, 47, 52, 437/60, 131, 235, 247, 919; 257/310

[56] References Cited

U.S. PATENT DOCUMENTS

| | | | |
|---|---|---|---|
| 3,878,549 | 4/1975 | Yamazaki et al. | 437/52 |
| 4,940,076 | 4/1990 | Hollam et al. | 437/24 |
| 5,384,152 | 1/1995 | Chu et al. | 437/52 |

FOREIGN PATENT DOCUMENTS

| | | | |
|---|---|---|---|
| 0056405 | 4/1983 | Japan | 437/131 |
| 0140450 | 6/1987 | Japan | 437/247 |
| 0090119 | 4/1988 | Japan | 437/131 |
| 0143220 | 6/1989 | Japan | 437/131 |

*Primary Examiner*—Tom Thomas
*Attorney, Agent, or Firm*—Mark A. Valetti; W. James Brady, III; Richard L. Donaldson

[57] ABSTRACT

The invention discloses modifying the surface of a device to reduce transition region growth so that higher anneal temperatures can be used with the device to optimize dielectric quality, reduce defect density, and achieve the lowest possible dielectric leakage. One method of surface modification occurs when an impurity such as germanium is added to a silicon surface before deposition of TA 205 to serve as a diffusion barrier or retardant, which would inhibit the growth of the silicon TA205 transition region at higher temperatures and prevent capacitance degradation. Germanium is a good choice for this application because of its similarities to silicon. However, other materials can also serve as barriers.

7 Claims, 2 Drawing Sheets

STRUCTURAL MODIFICATION TO ENHANCE DRAM GATE OXIDE QUALITY

This application is a continuation of application Ser. No. 07/907,414, filed Jul. 1, 1992, now abandoned.

BACKGROUND OF THE INVENTION

Ultra large scale integrated circuit (ULSI) memory devices require increased capacitance per unit area to allow small storage cell capacitors, to achieve high charge storage for soft error prevention, and to operate at 1.5 volts. Such capacitors must also meet stringent reliability considerations. Desirable properties of gate oxides include high dielectric constant for high capacitance, low electrical conductance, and high dielectric breakdown voltage.

Currently, there is great interest in oxides with high dielectric constants such as Ta2O5 for application as gate oxides in ULSI DRAMs and SRAMs. Recent publications have reported that the dielectric quality of Ta2O5 is greatly improved by high temperature annealing. In particular, annealing at up to 900° C. reduces the leakage current density to the 1E–12 range, with a major reduction (approximately 5000 times) occurring for temperatures between 800° C. and 900° C.

Annealing Ta2O5 at temperatures up to 900° is also beneficial in reducing the leakage current because the annealed film crystallizes into Beta-Ta2O5 and the defect density decreases such that hopping conductivity is reduced. For sufficiently high anneal temperature, i.e. 800°–900° C., hopping is substantially eliminated and Fowler-Nordheim tunneling at the top electrode (farthest away from the device substrate) of a capacitor structure in the storage device controls conduction through the oxide. An interfacial layer exists at the silicon-Ta2O5 boundary, and this transition layer is assumed to be leaky because it contains $TaSi_2$.

The silicon transition layer has a negative effect on dielectric capacitance because of its low dielectric constant, which gives the effective transition-oxide sandwich a lower dielectric constant. For annealing above 800° C., the transition region grows in thickness, causing a six fold decrease in capacitance at 900° C. Because of this limitation, the optimum anneal temperature for Ta2O5 is about 850° C. because higher temperatures give lower leakage but also lower capacitance.

SUMMARY OF THE INVENTION

The invention provides a modification of the silicon surface of a device to reduce transition region growth so that higher anneal temperatures can be used to optimize dielectric quality, reduce defect density and achieve the lowest possible dielectric leakage.

DETAILED DESCRIPTION OF THE INVENTION

Figure 1:
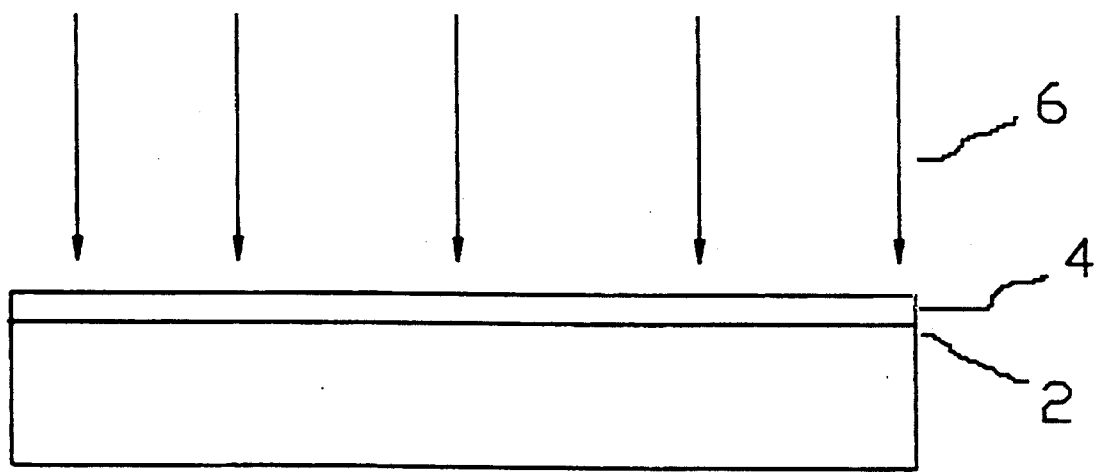
FIGS. 1 and 2 illustrate cross-sectional views of a portion of a capacitive structure.

In order to accommodate anneal temperatures necessary for the attainment of the foregoing discussed properties, the invention provides a modification of the silicon surface of a device. A first preferred embodiment of the invention shall be discussed with respect to FIG. 1 which illustrates a cross-sectional view of a portion of a capacitive structure. As shown in FIG. 1, the surface of a silicon substrate 2 is covered by or admixed with an impurity 4, such as germanium, prior to the deposition 6 (shown by arrows) of Ta2O5. This impurity may be deposited for example by sputtering, evaporation, plasma enhanced or vapor phase transfer techniques, may be implanted into the silicon surface, or may be formed by rapid thermal processing.

After these steps the capacitive structure can be and is subjected to high anneal temperatures such as 850° C. to 900° C. Impurity 4 serves as a diffusion barrier or retardant, which would inhibit the growth of a silicon-Ta2O5 transition region at these high anneal temperatures, thereby preventing capacitance degradation. Germanium is a good choice for impurity 4 because of its similarities to silicon, but other materials are also possible barriers.

Reducing the transition region thickness as discussed above is also expected to benefit device reliability. In order to reduce the susceptibility of the transition region to interfacial charges such as from hot electrons, the localized dielectric constant should be high as possible in order to enhance charge screening and additionally the transition region should be thin such as the case with the transition region resulting from processing according to the invention.

Figure 2:
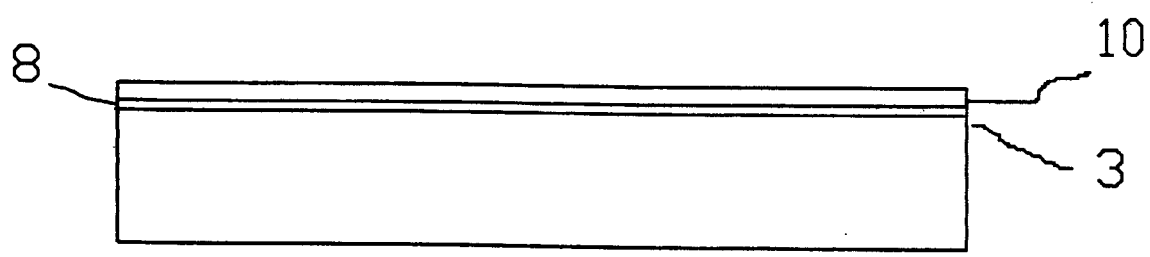

In principle, other surface treatments could be used for the same purposes as discussed above. For instance, with reference to FIG. 1, impurity 4 can represent a nitride layer which is grown on silicon surface 2 prior to the formation of a dielectric layer. Although FIG. 1 shows the deposition of a dielectric layer 6, it is also possible that a suitable dielectric layer can be grown on impurity 4. Further, impurity 4 can also represent a layer which is the result of a high dose implantation of a species such as nitrogen into the silicon surface 2 prior to dielectric formation. Additionally, with reference to FIG. 2 which illustrates a cross-sectional drawing of a portion of a capacitive structure, suitable surface modification to achieve the foregoing discussed properties can be achieved by depositing metal 8 on surface 3 which represents silicon or polysilicon, prior to dielectric 10 formation.

Other methods of surface modification can include chemically treating the surface of the device prior to dielectric formation, depositing an intermediate film on the surface of the device, such as by sputtering, evaporation, or other deposition technique, physically damaging or otherwise altering the surface of the device, such as with a plasma or vapor phase treatment, or altering the physical or chemical nature of the surface using rapid thermal processing techniques. The intent behind the surface modification is to form a barrier to inhibit diffusion or inter-reaction of the dielectric with either the top or bottom electrode of the capacitor.

Further, any of the foregoing techniques can be applied to the top of the dielectric after its formation in order to maintain the integrity of the top interface.

Although the foregoing invention has been described in detail herein with reference to its preferred embodiment and certain described alternatives, it is to be understood that this description is by way of example only and it is not to be construed in a limiting sense. It is to be further understood that numerous changes in the details of the embodiments of the invention, and additional embodiments of the invention, will be apparent to persons of ordinary skill in the art having reference to this description. For instance, although silicon is disclosed as the surface of the device, other semiconductor materials can be used to achieve similar results. For instance Ge, III–V compounds such as GaAs, II–VI compounds such as HgCdTe, SiC, and oxides are contemplated as surfaces upon which the processes of the invention may take place. In addition, it is also contemplated that the concept of surface modification applies to the usage of other dielectrics and ferroelectric materials such as niobium oxide, niobium pentoxide, or SrBa-titanate. The foregoing described invention can easily be used in a DRAM, EPROM, EEPROM, flash-EPROM, SRAM or other capacitance storage device. It is contemplated that all such changes and additional embodiments are within the spirit and true scope of the invention as claimed below.

I claim:

1. A method of forming a dielectric layer on a substrate, comprising the steps of:

providing a substrate comprising silicon, said substrate having a surface;

forming a germanium layer on the surface of said substrate; and forming a dielectric layer onto said germanium layer, said dielectric layer comprising $Ta_2O_5$.

2. A method as in claim 1 further comprising the step of annealing said layer of $Ta_2O_5$ on said germanium layer at a temperature approximately in the range of 800° C. to 900° C.

3. A method as in claim 1 wherein said layer of germanium is formed by implantation of germanium into the surface of said substrate.

4. A method as in claim 1 wherein said layer of germanium is formed by sputtering germanium onto the surface of said substrate.

5. A method as in claim 1 wherein said layer of germanium is formed by evaporation of germanium onto the surface of said substrate.

6. A method as in claim 1 wherein said layer of germanium is formed by plasma enhanced deposition of germanium onto the surface of said substrate.

7. A method as in claim 1 wherein said layer of germanium is formed by vapor phase deposition of germanium onto the surface of said substrate.

* * * * *